United States Patent

Shurboff et al.

[11] Patent Number: 5,859,890
[45] Date of Patent: Jan. 12, 1999

[54] DUAL MODULUS PRESCALER

[75] Inventors: Carl L. Shurboff, Grayslake; Matsuo M. Marti, Chicago, both of Ill.

[73] Assignee: Motorola, Inc., Schamburg, Ill.

[21] Appl. No.: 806,811

[22] Filed: Feb. 26, 1997

[51] Int. Cl.$^6$ .................................................. H03K 21/00
[52] U.S. Cl. .................... 377/48; 377/47; 377/52
[58] Field of Search ..................... 377/48, 47, 52

[56] References Cited

U.S. PATENT DOCUMENTS

| | | | |
|---|---|---|---|
| 3,970,941 | 7/1976 | Leuschner | 328/41 |
| 4,516,251 | 5/1985 | Gallup | 377/110 |
| 4,953,187 | 8/1990 | Herold et al. | 377/48 |
| 5,349,622 | 9/1994 | Gorisse | 377/48 |
| 5,714,896 | 2/1998 | Nakagawa et al. | 377/48 |
| 5,754,615 | 5/1998 | Colavin | 377/47 |

*Primary Examiner*—Margaret R. Wambach
*Attorney, Agent, or Firm*—John G. Rauch

[57] ABSTRACT

A dual-modulus prescaler (100) has improved performance for high-speed operation. A timing signal is developed from a flip flop circuit (106) two and one-half clock cycles before the last stage of the prescaler is clocked. The timing signal is used to produce a selector signal to gate a multiplexer (112). Because of the early generation of the timing signal, the multiplexer selection process is removed from the critical path. The remaining delay through the multiplexer is minimal to minimize the critical path of the prescaler.

13 Claims, 2 Drawing Sheets

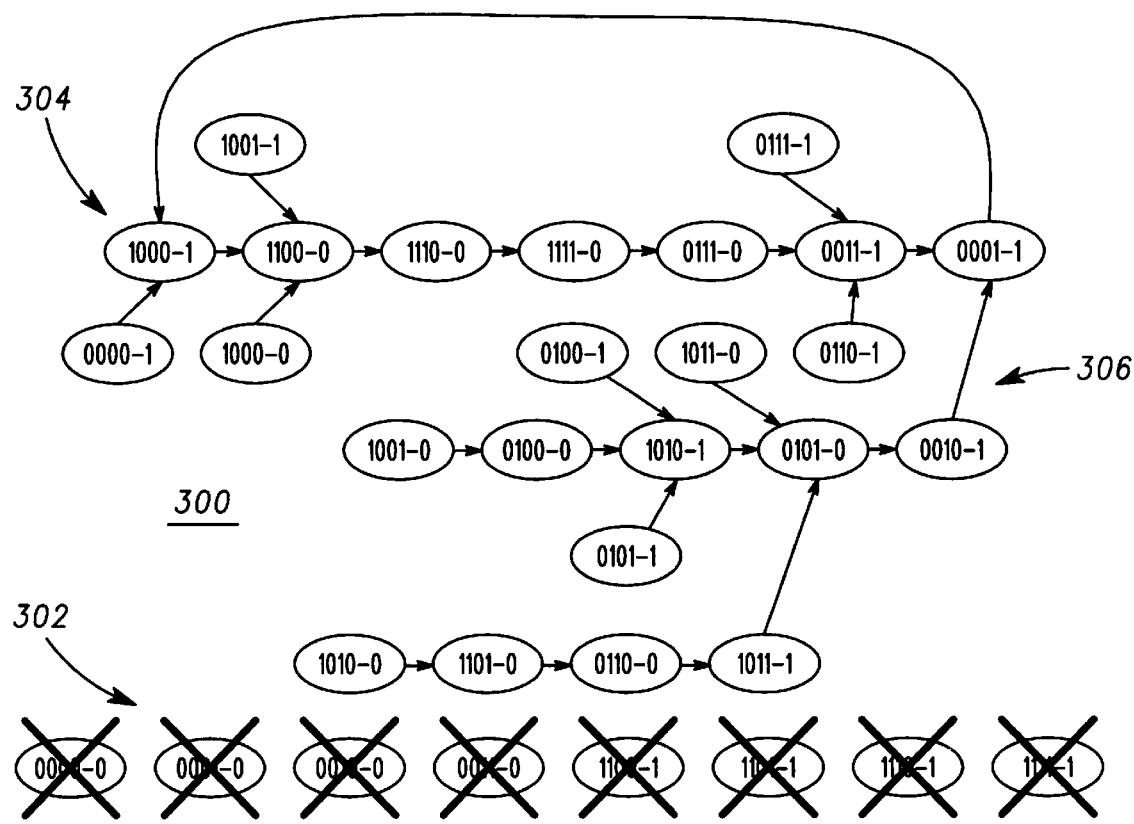
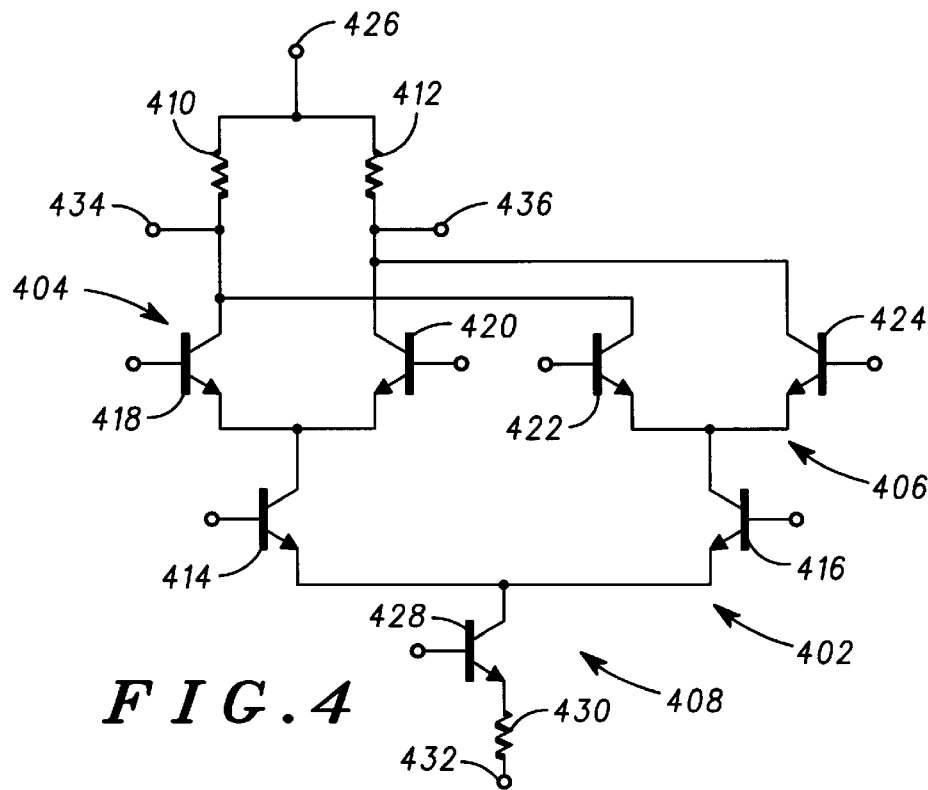
FIG.3
FIG.4

DUAL MODULUS PRESCALER

FIELD OF THE INVENTION

The present invention relates generally to dividing or counting circuitry. More specifically, the invention concerns a low power, high speed prescaler usable in such applications as phase-lock-loop frequency synthesizers.

BACKGROUND OF THE INVENTION

Prescaler circuits for use in high speed dividers, frequency synthesizers and the like are well known in the art. A dual modulus prescaler is a counter whose division ratio or modulus can be switched from one value to another by an external control signal. Commonly known implementations of prescalers utilize a counter circuit consisting of series-coupled flip flop circuits which are used to obtain a fractional output signal from a clock signal. Thus, a prescaler can divide by a first factor when the external control signal has a first state or by a second factor when the external control signal has a second state.

Current and future telecommunication devices require very high speed prescaler circuits. For example, cellular radiotelephones that operated in the 800–900 MHz band are being joined in the market by Personal Communication Systems (PCS) and satellite radiotelephones operating at 1800–2000 MHz. A prescaler for use in such radiotelephones must operate at these high frequencies under worst case conditions.

In addition, modern telecommunication devices have placed additional operational requirements on the performance of prescalers in these devices. Portable radiotelephones require very low power dissipation to enhance portability and long-term use between battery recharge. Thus, prescalers used in portable devices must have very low power dissipation. In addition, to reduce power dissipation even more, supply voltage levels for electronic circuits in portable devices are being lowered. Typical values for future operating voltages are 2.0 volts with 1.7 volts as a worst case value. A suitable prescaler must operate at very high frequencies and at very low voltage while dissipating little power.

Accordingly, there is a need in the art for a prescaler circuit providing high speed operation at low power levels and a low operating voltage.

BRIEF DESCRIPTION OF THE DRAWINGS

The features of the present invention, which are believed to be novel, are set forth with particularity in the appended claims. The invention, together with further objects and advantages thereof, may best be understood by making reference to the following description, taken in conjunction with the accompanying drawings, in the several figures of which like reference numerals identify identical elements, and wherein:

FIG. 3 is a state transition diagram for the prescaler of FIG. 1; and

FIG. 4 is a circuit diagram of the multiplexer of FIG. 1.

DETAILED DESCRIPTION OF A PREFERRED EMBODIMENT

Figure 1:
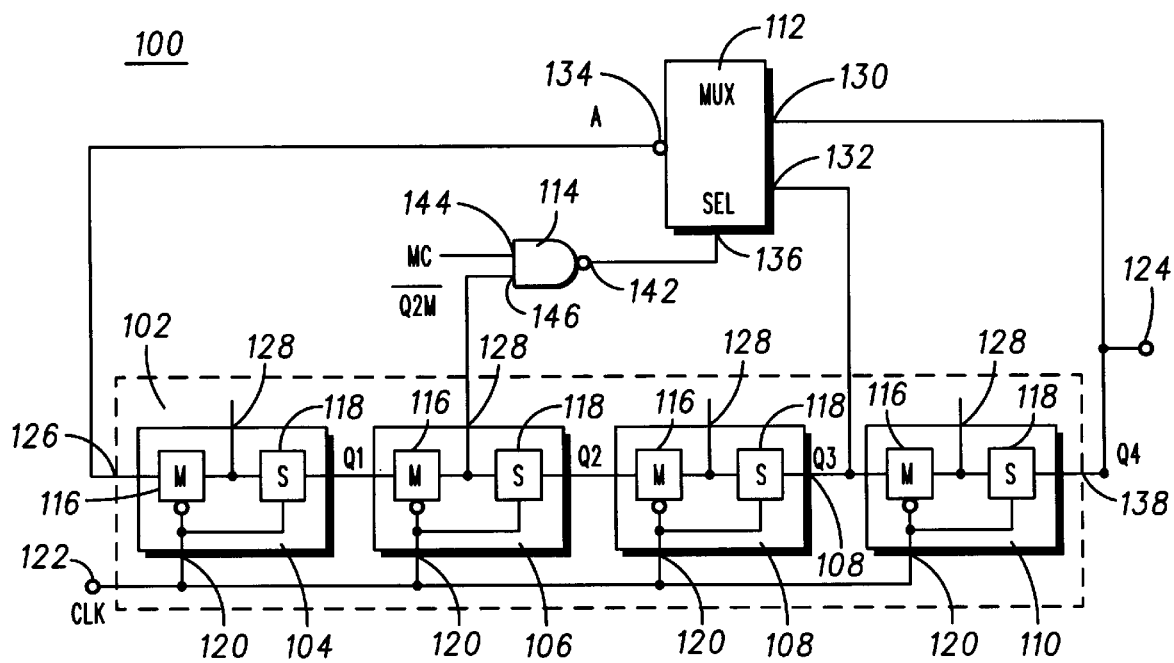
FIG. 1 is a block diagram of a prescaler according to the present invention.

Referring now to FIG. 1, a prescaler 100 includes a plurality 102 of sequentially coupled flip flop circuits, including a first flip flop circuit 104, a second flip flop circuit 106, a third flip flop circuit 108 and a fourth flip flop circuit 110. The prescaler 100 further includes a switch circuit such as a multiplexer 112 and a logic circuit 114. The prescaler 100 has a clock input 122 configured to receive a clock signal and an output 124. Preferably, the prescaler 100 is fabricated in a monolithic integrated circuit using a high-speed, low power technology, such as emitter coupled logic technology. For high speed operation, it will be recognized that many of the interconnections illustrated in the drawing actually represent differential signal connections.

Preferably, each flip flop circuit of the plurality 102 of flip flop circuits is substantially identical in construction and operation. Each flip flop circuit includes a master latch 116 and a slave latch 118 coupled in master-slave configuration. The slave latch 118 is driven by an output signal from the master latch 116. The master latch 116 is driven by the previous flip flop circuit. The plurality 102 of flip flop circuits has an input 126 driven by a feedback signal from the multiplexer 112. Each flip flop circuit has a clock input 120 for receiving the clock signal. The plurality 102 of flip flop circuits is sequentially coupled for clocking data through the plurality of flip flop circuits in response to the clock signal. In accordance with the present invention, each flip flop circuit has an output 128 for providing an internal signal of the flip flop circuit.

The multiplexer 112 has a first input 130 and a second input 132, an output 134 and a selector input 136. In the illustrated embodiment, the first input 130 is coupled to the output 138 of the last flip flop circuit, fourth flip flop circuit 110 and the second input 132 is coupled to the output 140 of the next-to-last flip flop circuit, third flip flop circuit 108. The output 134 is coupled to the input 126 of the plurality 102 of flip flop circuits. The selector input 136 is coupled to the output 142 of the logic circuit 114.

The multiplexer 112 operates to couple either the first input 130 or the second input 132 to the output in response to a selector signal applied to the selector input 136. Thus, the multiplexer is responsive to the selector signal for selectively coupling one of an output of a last flip flop circuit, fourth flip flop circuit 110, of the plurality 102 of flip flop circuits and an output of a next-to-last flip flop circuit, third flip flop circuit 108, to the output 134 of the multiplexer 112. The multiplexer 112 receives an output signal from the output 138 of the last flip flop circuit and provides a feedback signal to the input 126 in response to the selector signal. The structure of the multiplexer 112 will be discussed below in conjunction with FIG. 4.

The logic circuit 114 has a first input 144 and a second input 146. The first input 144 is configured to receive a modulus control signal. The second input 146 is coupled to the output 128 of the second flip flop circuit 106 for detecting and receiving a timing signal. In the illustrated embodiment, the timing signal is an internal signal of the second flip flop circuit 106 provided at the output 128 of the second flip flop circuit 106. More specifically, in the illustrated embodiment, the timing signal is produced by the master latch 116 of the second flip flop circuit 106. The timing signal may be detected by the logic circuit 114 at any suitable location in the circuit. Thus, the logic circuit 114 is coupled to the switch circuit or multiplexer 112 for providing the selector signal in response to the timing signal from a flip flop circuit, such as second flip flop circuit 106.

The logic circuit 114 is a NAND gate in the illustrated embodiment. However, other logic circuit configurations may be used as required by signal levels, signal timing and other considerations.

The illustrated embodiment is a divide by 7, divide by 8 prescaler. The division ratio or modulus is controlled by a modulus control signal received at the modulus control input 144. The prescaler divides the predetermined clock frequency of a clock signal received at the clock input 122 by a predetermined modulus, such as 7 or 8, in response to the state of the modulus control signal, and produces the feedback signal at the divided frequency. The modulus of the prescaler can be varied to any suitable value by varying the number of flip flop circuits and the point at which the second input 146 of the logic circuit 114 is coupled to the plurality 102 of logic circuits as well as other connections in the circuit.

In accordance with the present invention, the logic circuit 114 provides the selector signal to the multiplexer 112 before the last flip flop circuit, such as fourth flip flop circuit 110, provides the output signal to the multiplexer 112. In a typical embodiment, the modulus control signal at the modulus control input 144 is maintained at a invariant or DC level once the modulus is chosen. In this configuration, the logic circuit 114 operates as a buffer for the timing signal. As a result, the delay from the transition on the timing signal (labelled $\overline{Q2m}$ in FIG. 1) to the transition on the selector signal (labelled Sel in FIG. 1) is only a single gate delay. In contrast, the delay from the timing signal to the first input 130 of the multiplexer 112 is the clocked delay through the slave latch 118 of the second flip flop circuit 106 and through the third flip flop circuit 108 and the fourth flip flop circuit 110. In accordance with the present invention, the logic circuit 114 receives the timing signal from the flip flop circuit a sufficient number of clock cycles before the switch circuit 112 receives either an output signal from the fourth flip flop circuit 110 or an output signal from the third flip flop circuit 108, so that the logic circuit 114 provides the selector signal to configure the switch circuit or multiplexer 112 to provide the feedback signal immediately in response to the switch circuit receiving the output signal.

Thus, the logic circuit 114 provides the selector signal to the selector input 136 in response to the timing signal to remove the selector signal from a critical path of the prescaler 100. The critical path is the path through the prescaler 100 which limits the operation, including the maximum operating frequency of the prescaler 100, including under worst case conditions of temperature and supply voltage. In the illustrated embodiment, the critical path is from the output 138 of the last or fourth flip flop circuit 110, through the multiplexer 112 to the input 126. The rest of the delays in the loop formed by the prescaler 100 are clocked and therefore are not part of the critical path.

Figure 2:
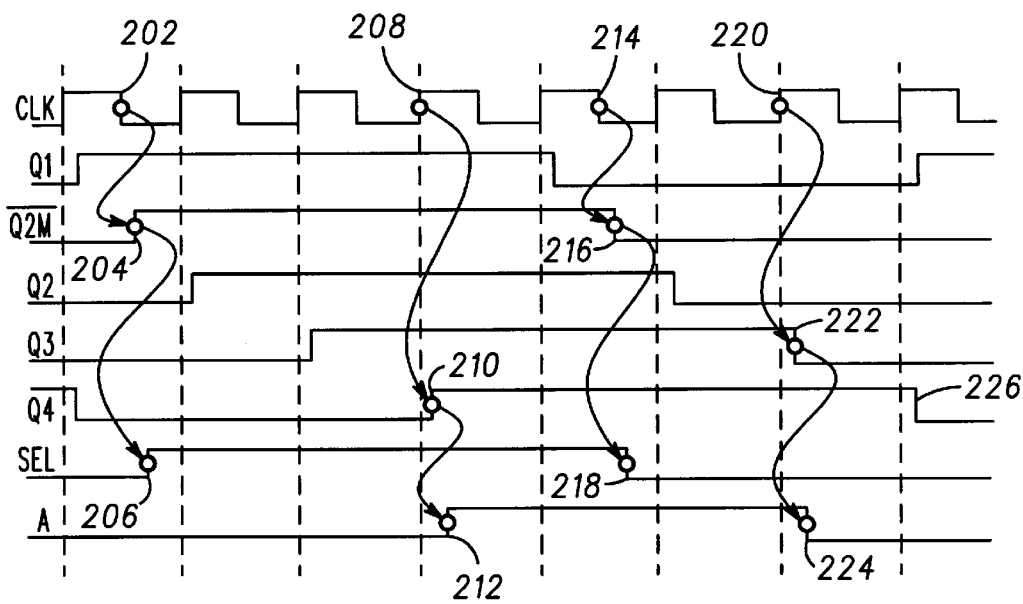
FIG. 2 is a timing diagram for the prescaler of FIG. 1.

FIG. 2 shows a timing diagram for the prescaler 100 of FIG. 1 operated in divide by 7 mode. Signal identifiers correspond to identifiers in FIG. 1. A clock signal Clk having a predetermined clock frequency is applied to the clock input 122. An output signal Q4 is produced at the output 124 at a frequency one-seventh the predetermined clock frequency.

FIG. 2 illustrates some of the operational features of the prescaler of FIG. 1. The first negative transition 202 of the clock signal Clk clocks data through the master latch 116 of the second flip flop circuit 106, labelled Q2m in FIG. 2, producing a positive transition 204 on Q2m. This positive transition on the timing signal Q2m in turn produces a transition 206 on the selector signal Sel. Thus the selector signal is removed from the critical path of the prescaler 100, as two and one-half clock cycles later, a negative transition 208 on the clock signal Clk clocks data out of the last flip flop circuit, fourth flip flop circuit 110, as a positive transition 210 on the output signal labelled Q4. Since the selector signal is already established at the multiplexer 112, the delay along the critical path from the output signal Q4 to the positive transition 212 on the feedback signal A is only the delay through the multiplexer 112.

Similarly, the negative transition 214 on the clock signal Clk produces a positive transition 216 on Q2m as data is clocked through the master latch 116 of the second flip flop circuit 106. In turn, a negative transition 218 is produced on the selector signal Sel to configure the multiplexer 112. One and one-half clock cycles later, a positive transition 220 on the clock signal Clk reduces a negative transition 222 on the output signal of the third flip flop circuit 108. Labelled Q3 in FIG. 2. This negative transition 222 is fed back to the input 126 as a negative transition 224 on the feedback signal A. Meanwhile, the phase of the output signal Q4 is completed as a negative transition 226 on Q4.

FIG. 3 shows a state diagram for the prescaler 100 of FIG. 1 operated in divide by seven mode. Each state shows the logic state of the output signals Q1, Q2, Q3 and Q4 of the four flip flop circuits and the feedback signal A. The state diagram includes eight "don't care" states 302 at the bottom of the diagram. These states are not possible since the timing signal Q2M is take from the master latch 116 of the second flip flop circuit. The timing signal must be either the value of the first or second stages, depending on the phase of the clock signal Clk. The state diagram includes seven valid or repeating states 304. The state diagram also includes seventeen invalid states 306. All of these invalid states feed directly or indirectly into valid states of the divide by seven mode. This is important because, on power-up or after reset, the states of the flip flop circuits are unknown. Within just a few clock cycles, the prescaler 100 will exit an invalid state and enter a valid, repeating state.

FIG. 4 is a circuit diagram of a multiplexer 400 for use with the prescaler 100 of FIG. 1. The multiplexer 400 is formed using emitter coupled logic (ECL) for high speed performance and is suitable for applications at low supply voltage. For example, the multiplexer 400 is operational at supply voltages as low as 1.8 V.

The multiplexer 400 includes a first current switch 402, a second current switch 404, a third current switch 406, a current source 408, a first load resistor 410 and a second load resistor 412. The first current switch 402 includes a first transistor 414 and a second transistor 416 having coupled emitters. The base of first transistor 414 is configured to receive the selector signal, Sel. The base of the second transistor 416 is configured to receive the logical complement of the selector signal, $\overline{\text{Sel}}$. The second current switch 404 includes a first transistor 418 and a second transistor 420. The emitters of the first transistor 418 and the second transistor 420 are coupled together and are coupled to the collector of first transistor 414. The base of the first transistor 418 is configured to receive a first input signal, such as the output signal Q4 of the fourth flip flop circuit 110 (FIG. 1) and the base of the second transistor 420 is configured to receive the complement of the first input signal. The third current switch 406 includes a first transistor 422 and a second transistor 424 The emitters of the first transistor 422 and the second transistor 424 are coupled together and are coupled to the collector of second transistor 416. The base of the first transistor 422 is configured to receive a second input signal, such as the output signal Q3 of the third flip flop circuit 108 (FIG. 1) and the base of the second transistor 424 is configured to receive the complement of the second input signal. The collectors of first transistor 418 and first transistor 422 are coupled together and coupled through load resistor 410 to a positive supply voltage 426. The collectors of second transistor 420 and second transistor 424 are coupled together and coupled through load resistor 412 to the positive supply voltage 426. The output signal of the multiplexer 400, such as the feedback signal A in FIG. 1, is provided at an output 434, and the complement output signal is provided at an output 436.

The current source 408 includes a transistor 428 and a resistor 430. The base of the transistor 428 is configured to received a reference potential. The collector of the transistor 428 is coupled to the emitters of first transistor 414 and second transistor 416. The resistor 430 is coupled between the emitter of the transistor 420 and a negative supply voltage 432. In response to the reference voltage, the current source provides at the collector of the transistor 428 a well-regulated reference current compensated against variations in temperature and supply voltage.

When operated in conjunction with the prescaler 100 (FIG. 1), the multiplexer 400 provides minimal delay in the critical path of the prescaler 100. The selector signal Sel and its complement $\overline{Sel}$ are applied to the first current switch 402. The multiplexer 400 is thus configured to provide the feedback signal A as the output signal immediately upon receipt of Q3 or Q4. The only delay inserted in the critical path of the prescaler 100 by the multiplexer 400 is the switching time of the emitter coupled current switches, second current switch 404 and third current switch 406.

As can be seen from the foregoing, the present invention provides a dual-modulus prescaler having improved performance for high-speed operation. A timing signal is developed from a flip flop circuit two and one-half clock cycles before the last stage of the prescaler is clocked. The timing signal is used to produce a selector signal to gate a multiplexer. Because of the early generation of the timing signal, the selection process is removed from the critical path. The remaining delay through the multiplexer is minimal to minimize the critical path of the prescaler.

While a particular embodiment of the present invention has been shown and described, modifications may be made. For example, while the prescaler stages are shown formed from master-slave flip flops, any suitable logic element may be used. Similarly, the number of stages forming the prescaler may be varied to vary the modulus of the prescaler. It is therefore intended in the appended claims to cover all such changes and modifications which fall within the true spirit and scope of the invention.

What is claimed is:

1. A prescaler comprising:
    a plurality of sequentially coupled flip flop circuits having an input;
    a switch circuit coupled to the input, the switch circuit receiving an output signal from a last flip flop circuit and providing a feedback signal to the input in response to a selector signal; and
    a logic circuit coupled to the switch circuit for providing the selector signal in response to a timing signal from a flip flop circuit, the logic circuit providing the selector signal before the last flip flop circuit provides the output signal.

2. A prescaler as recited in claim 1 wherein each flip flop circuit has a clock input for receiving a clock signal having a predetermined clock frequency, the prescaler sequentially clocking data through the plurality of sequentially coupled flip flop circuits in response to the clock signal.

3. A prescaler as recited in claim 2 wherein the logic circuit has a first input coupled to the flip flop circuit and a second input for receiving a modulus control signal, the prescaler dividing the predetermined clock frequency by a predetermined modulus in response to the modulus control signal to produce the feedback signal having a divided frequency.

4. A prescaler as recited in claim 1 wherein the switch circuit comprises a multiplexer having a multiplexer output coupled to the input of the prescaler, a first input coupled to an output of the last flip flop circuit, a second input coupled to an output of a next-to-last flip flop circuit of the plurality of sequentially coupled flip flop circuits, and a selector input for receiving the selector signal, the multiplexer selectively coupling one of the first input and the second input to the multiplexer output in response to the selector signal.

5. A prescaler as recited in claim 4 wherein the logic circuit receives the timing signal from the flip flop circuit a sufficient number of clock cycles before the switch circuit receives the output signal so that the logic circuit provides the selector signal to configure the multiplexer to provide the feedback signal immediately in response to the multiplexer receiving a signal at one of the first input and the second input.

6. A prescaler for dividing a clock signal by a predetermined modulus and producing an output signal, the prescaler comprising:
    a plurality of flip flop circuits, each flip flop circuit having a clock input for receiving the clock signal, the plurality of flip flop circuits being sequentially coupled for clocking data through the plurality of flip flop circuits in response to the clock signal;
    a multiplexer responsive to a selector signal for selectively coupling one of an output of a last flip flop circuit of the plurality of flip flop circuits and an output of a next-to-last flip flop circuit to a multiplexer output, the multiplexer output being coupled to an input of a first flip flop circuit; and
    a logic circuit coupled to one flip flop circuit of the plurality of flip flop circuits for receiving a timing signal and providing the selector signal in response to the timing signal to remove the selector signal from a critical path of the prescaler.

7. A prescaler as recited in claim 6 wherein the one flip flop circuit comprises a master latch and a slave latch, the slave latch driven by an output signal of the master latch, the timing signal comprising the output signal of the master latch.

8. A prescaler as recited in claim 6 wherein the one flip flop circuit is coupled in sequence between the first flip flop circuit and the next-to-last flip flop circuit.

9. A prescaler as recited in claim 6 wherein the logic circuit further comprises a modulus control input for receiving a modulus control signal, the logic circuit providing the selector signal in response to the modulus control signal, the modulus control signal establishing the predetermined modulus.

10. A dual modulus prescaler comprising:
    a clock input for receiving a clock signal having a predetermined frequency;
    a plurality of sequentially coupled flip flop circuits, each flip flop circuit having a clock input for receiving the clock signal, each flip circuit including a master latch and a slave latch, the slave latch driven by the master latch, a first flip flop circuit having an input for receiving a feedback signal, a last flip flop circuit having an output for providing a first output signal, a next-to-last flip flop circuit having an output for providing a second output signal;

a switch circuit coupling the output to the input, the switch circuit providing a feedback signal to the input in response to one of the first output signal and the second output signal in response to a selector signal; and a logic circuit coupled to a flip flop circuit for detecting a timing signal and providing the selector signal to the switch circuit for selecting one of the first output signal and the second output signal, the first output signal corresponding to a first modulus and the second output signal corresponding to a second modulus.

11. A dual modulus prescaler as recited in claim 10 wherein the flip flop circuit is coupled between the first flip flop circuit and the last flip flop circuit, the timing signal being produced by the master latch of the flip flop circuit.

12. A dual modulus prescaler as recited in claim 11 wherein the logic circuit receives the timing signal from the flip flop circuit a sufficient number of clock cycles before the switch circuit receives the one of the first output signal and the second output signal so that the logic circuit provides the selector signal to configure the switch circuit to provide the feedback signal immediately in response to the switch circuit receiving the one of the first output signal and the second output signal.

13. A dual modulus prescaler as recited in claim 11 wherein the logic circuit includes a first input for receiving the timing signal and a second input for receiving a modulus control signal, the logic circuit providing the selector signal in response the timing signal and the modulus control signal.

\* \* \* \* \*